(12) United States Patent
Tsuchiko

(10) Patent No.: US 8,987,821 B2
(45) Date of Patent: Mar. 24, 2015

(54) LDMOS WITH ACCUMULATION ENHANCEMENT IMPLANT

(71) Applicant: Alpha and Omega Semiconductor Incorporated, Sunnyvale, CA (US)

(72) Inventor: Hideaki Tsuchiko, San Jose, CA (US)

(73) Assignee: Alpha and Omega Semiconductor Incorporated, Sunnyvale, CA (US)

( * ) Notice: Subject to any disclaimer, the term of this patent is extended or adjusted under 35 U.S.C. 154(b) by 0 days.

(21) Appl. No.: 14/061,990

(22) Filed: Oct. 24, 2013

(65) Prior Publication Data

US 2014/0048880 A1 Feb. 20, 2014

Related U.S. Application Data

(62) Division of application No. 13/431,629, filed on Mar. 27, 2012, now Pat. No. 8,592,274.

(51) Int. Cl.

| H01L 29/76 | (2006.01) |
|---|---|
| H01L 29/94 | (2006.01) |
| H01L 29/78 | (2006.01) |
| H01L 29/08 | (2006.01) |
| H01L 29/423 | (2006.01) |

(52) U.S. Cl.
CPC ........ *H01L 29/7816* (2013.01); *H01L 29/7835* (2013.01); *H01L 29/0847* (2013.01); *H01L 29/42368* (2013.01)

USPC .......... 257/343; 257/330; 257/335; 257/336; 257/341

(58) Field of Classification Search
CPC .................................................... H01L 29/7816
USPC .......... 257/343, 330, 335–336, 341; 438/259
See application file for complete search history.

(56) References Cited

U.S. PATENT DOCUMENTS

| 6,620,697 | B1 | 9/2003 | Alok et al. | |
|---|---|---|---|---|
| 6,797,549 | B2 * | 9/2004 | Hebert | 438/159 |
| 7,355,260 | B2 * | 4/2008 | Khemka et al. | 257/471 |
| 7,592,683 | B2 | 9/2009 | Iwabuchi et al. | |
| 8,592,274 | B2 | 11/2013 | Tsuchiko | |

* cited by examiner

*Primary Examiner* — Theresa T Doan
(74) *Attorney, Agent, or Firm* — Joshua D. Isenberg; JDI Patent

(57) ABSTRACT

A lateral double-diffused metal-oxide-semiconductor (LDMOS) transistor device includes an enhancement implant region formed in a portion of an accumulation region proximate a P-N junction between body and drift drain regions. The enhancement implant region contains additional dopants of the same conductivity type as the drift drain region. There is a gap between the enhancement implant region and the P-N junction. It is emphasized that this abstract is provided to comply with the rules requiring an abstract that will allow a searcher or other reader to quickly ascertain the subject matter of the technical disclosure. It is submitted with the understanding that it will not be used to interpret or limit the scope or meaning of the claims.

9 Claims, 3 Drawing Sheets

LDMOS WITH ACCUMULATION ENHANCEMENT IMPLANT

PRIORITY CLAIM

This Application is a divisional of U.S. patent application Ser. No. 13/431,629, filed Mar. 27, 2012, to Hideaki Tsuchiko entitled "LDMOS WITH ACCUMULATION ENHANCEMENT IMPLANT", the entire disclosures of which are incorporated by reference herein.

FIELD OF THE INVENTION

Embodiments of the present invention relate to high voltage semiconductor devices and the manufacturing process thereof and, in particular, to lateral double-diffused metal-oxide-semiconductor (LDMOS) transistors with accumulation enhancement implant and thick accumulation oxide.

BACKGROUND OF THE INVENTIONS

Lateral double-diffused metal-oxide-semiconductor (LDMOS) transistors are commonly used in high-voltage applications (20 to 500 volts) because of their high breakdown voltage characteristics and compatibility with low voltage CMOS technology. In general, an N-type LDMOS transistor includes a polysilicon gate, an N+ source region formed in a P-type body region, and an N+ drain region. The N+ drain region is separated from the channel formed in the body region under the polysilicon gate by an N drift region. It is well known that by increasing the length of the N-drift region, the breakdown voltage of the LDMOS transistor can be accordingly increased.

FIG. 1 is a cross-sectional diagram showing an existing LDMOS device 100 provided as a high voltage N-channel Lateral DMOS (LDMOS). It is noted that this type of device can be formed in an N-type epitaxial layer, a P-type epitaxial layer or a P-type substrate. The N-channel LDMOS device 100 formed in either an epitaxial layer or a P-type substrate 110 includes a N+ source region 120 disposed in a P-well body region 112 and a N+ drain contact pickup region 122 disposed in N-drift drain region 114. A P+ body pickup region 124 is also formed on a top portion of the P-well body region 112 laterally adjacent to the source region 120. A field oxide (FOX) 116 is formed on a top portion of the N-drift drain region 114 right next to the drain contact pickup region 122 and an insulated gate 118 disposed on top of the P-well body region 112 and the N-drift drain region 114 extends from overlapping a portion of the source region 120 to overlapping a portion of the field oxide 116. The insulated gate 118 is electrical insulated from the substrate 110 by a thin gate oxide (not shown). An active channel 126 is formed in the P-well body region underneath the gate 118 from the source region 120 to the P-N junction between the P-well body region 112 and the N-drift drain region 114 and an accumulation region 128 is region formed in the N-drift drain region 114 underneath the gate 118 from the PN junction to the first end of the field oxide 116 closer to the PN junction.

The existing N channel LDMOS with butting P-well body region and lightly doped N-drift drain region as described above may have poor quasi-saturation, poor hot carrier injection (HCl) performance and/or high $R_{dsON}$.

It is within this context that embodiments of the present invention arise.

BRIEF DESCRIPTION OF THE DRAWINGS

Other objects and advantages of the invention will become apparent upon reading the following detailed description and upon reference to the accompanying drawings in which.

DESCRIPTION OF THE SPECIFIC EMBODIMENTS

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the figure(s) being described. Because components of embodiments of the present invention can be positioned in a number of different orientations, the directional terminology is used for purposes of illustration and is in no way limiting. It is to be understood that other embodiments may be utilized and structural or logical changes, including changes in the order of process steps, may be made without departing from the scope of the present invention. The following detailed description, therefore, is not to be taken in a limiting sense, and the scope of the present invention is defined by the appended claims.

Figure 2:
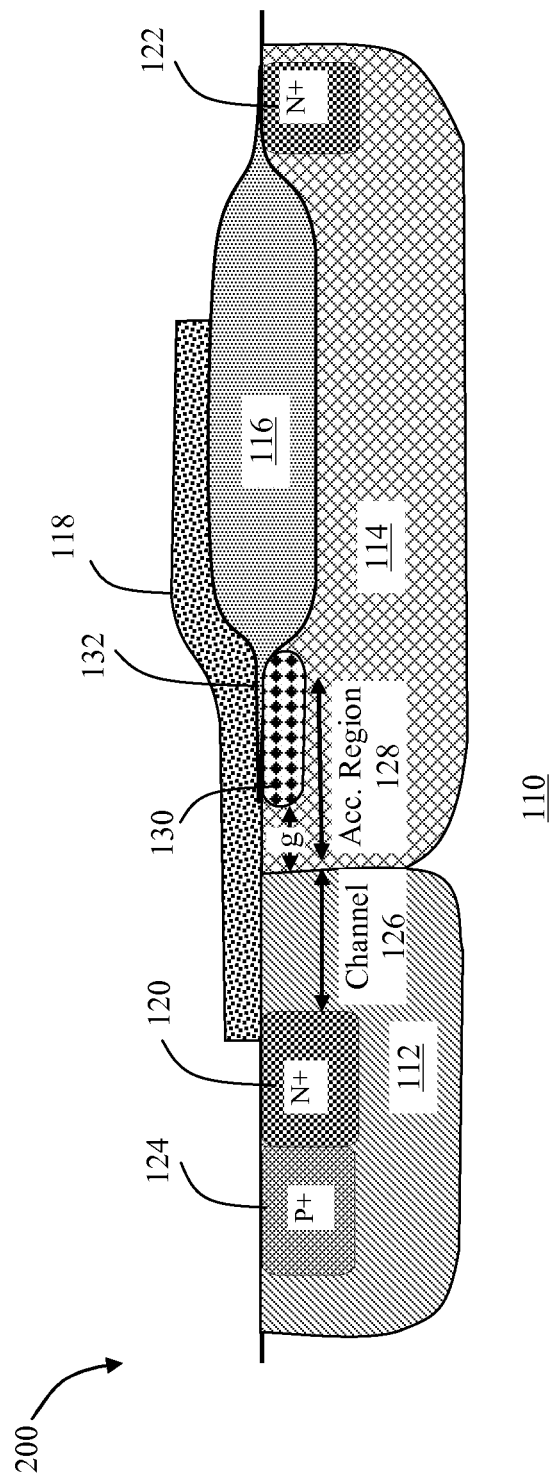
FIG. 2 is a cross-sectional diagram illustrating an N-channel LDMOS device according to an embodiment of the present invention.

According to embodiments of the present invention, quasi-saturation behavior, hot carrier injection (HCl) performance and the $R_{dsON}$ may improve in LDMOS devices by implantation of an enhancement portion into the accumulation region and a long bird's beak of Local Oxidation of Silicon (LOCOS) grown in the same region. The enhancement portion has the same carrier type as the epitaxial layer. FIG. 2 is a cross-sectional schematic diagram of an N-channel LDMOS 200 according to an embodiment of the present invention. The N-channel LDMOS device 200 formed in a P-type substrate 110 includes a N+ source region 120 disposed in a P-well body region 112 and an N+ drain contact pickup region 122 disposed in N-drift drain region 114. A P+ body pickup region 124 is also formed on a top portion of the P-well body region 112 adjacent to the source region 120. A field insulator, e.g., a field oxide (FOX), 116 is formed on a top portion of the N-drift drain region 114 right next to the drain contact pickup region 122 and an insulated gate electrode 118 disposed on top of the P-well body region 112 and the N-drift drain region 114 extends from overlapping a portion of the source region 120 to overlapping a portion of the field oxide 116. The insulated gate 118 may be electrically insulated from the substrate 110 by a thin gate oxide (not shown). A P-type active channel 126 is formed in the P-well body region underneath the gate 118 from the source region 120 to the P-N junction between the P-well body region 112 and the N-drift drain region 114 and an N-type accumulation region 128 is formed in the N-drift drain region 114 underneath the gate 118 from the P-N junction to a first end of the field oxide 116 close to the P-N junction.

In embodiments of the present invention, additional dopants of the same conductivity type as the accumulation region may be implanted into a portion of the accumulation region to form an enhancement implant region. By way of example, and not by way of limitation, for an N-channel LDMOS, N-type dopants may be implanted at the top portion in the accumulation region 128 forming an enhancement implant region 130. The N-type implant region 130 increases the net carrier concentration in the accumulation region and reduces the resistivity in accumulation region. Thus, the quasi-saturation at high gate bias and the high $R_{dsON}$ are improved. It is noted that for a P-type LDMOS device, P-type dopants may be used to form the enhancement region 130.

There is a gap g between the implant region 130 and the edge of P-well body region 112 so that the threshold voltage of the FET region is not reduced. Furthermore, the implant region 130 increases potential at a bird's beak portion 132 of the field oxide 116 when high bias is applied to the drain. Therefore, a long bird's beak 132 may be grown under the gate 118 to increase the breakdown voltage between the gate and the gate oxide. The bird's beak portion 132 of the field oxide 116 is generally thinner than the main portion 116 of the field oxide.

EXPERIMENTS

Figure 3:
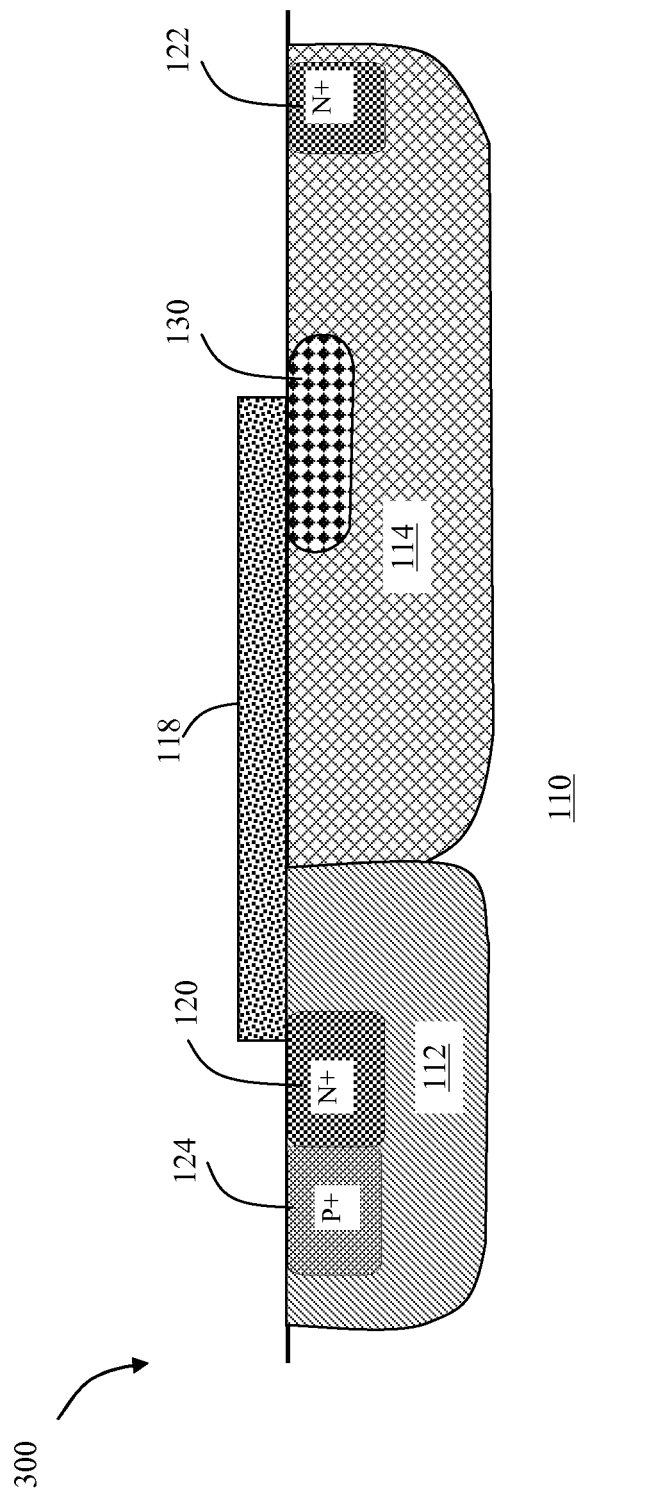
FIG. 3 is a cross-sectional diagram illustrating an N-channel LDMOS device without the field oxide and with accumulation enhancement implant of the present invention.

Experiments using process and device simulation have been carried out, which simulate implantation of arsenic into an accumulation region with different accumulation lengths ($L_{acc}$) cell pitch after the field oxidation is formed as shown in Table I below and in corresponding plots in the graph depicted in FIG. 3. The doping concentration of arsenic in these simulations was either zero or in the range of $10^{12}$ cm$^{-2}$ for each accumulation length.

TABLE I

| $L_{acc}$ | Acc Imp | $R_{dsON} \cdot A$ | Quasi Sat |
|---|---|---|---|
| Short | No | High | Poor |
| Short | Yes | Low | Poor |
| Medium | No | High | Good |
| Medium | Yes | Low | Good |
| Long | No | High | Good |
| Long | Yes | Low | Best |

Figure 1:
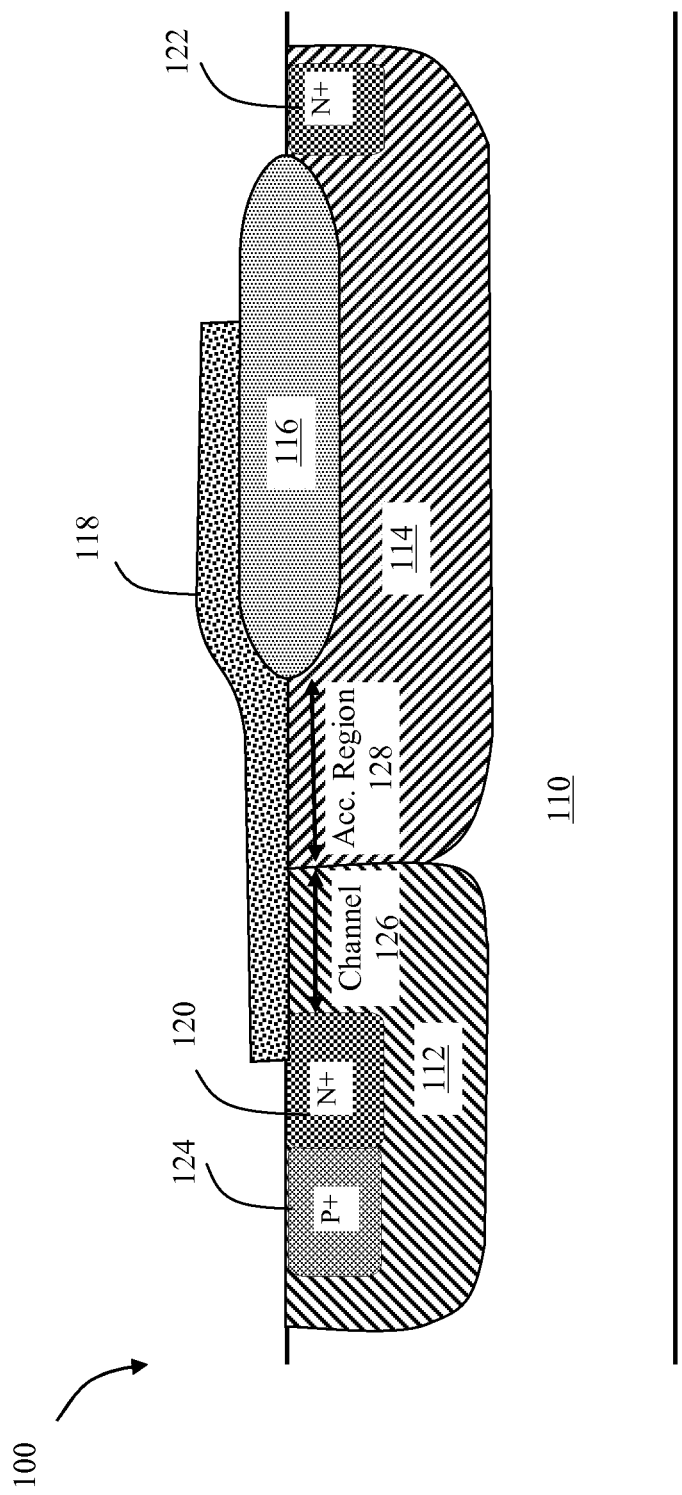
FIG. 1 is a cross-sectional diagram illustrating a conventional N-channel LDMOS device.

An LDMOS with having an accumulation enhancement implant and a long bird's beak, e.g., as shown in FIG. 2, can be manufactured with the conventional method for manufacturing a conventional LDMOS, as shown in FIG. 1, with some additional steps.

In the conventional process, for an N-channel LDMOS, a starting silicon P-substrate 110 with either N-type or P-type epitaxial layer or without epitaxial layer supported on the substrate is provided. P-type implantation is carried out to form P-well body region 112 followed with an N-type implant to form N-drift drain region 114 at the top portions of the substrate 110.

A field oxide 116 is then formed on a surface of the substrate 110. The bird's beak 132 of the field oxidation may be intentionally made long. To form the bird's beak 132, a thin layer of oxide may be formed on the surface of the substrate 110 and a nitride film may be formed on the thin oxide. As is well known, the length of the bird's beak portion 132 can be controlled by optimization of thickness of the nitride film and the underlying thin oxide. As an alternative to growing the bird's beak of the field oxide, a thick insulator, e.g., a thick oxide may be grown under the gate 118.

An enhancement implant of N-type dopants is carried out, after field oxide formed, through sacrificial oxide (not shown) into the accumulation region 128 forming the enhancement implant region 130. Drain side of the implant opening overlaps with field oxide, so that the implant is self-aligned.

Next, a polysilicon gate 118 can be formed on the surface of the thin gate oxide and the field oxide 116. Source region 120 doped with the high concentration N-type dopants can be formed in a region adjacent to the P+ body contact region 124 in the surface of the P-well body region 112 and drain contact pickup region 122 also doped with the high concentration N-type dopants in the surface of the N-drift drain region 114. As a result, the source region 120 and the drain contact pickup region 122 are formed at both sides of the field oxide 116 and isolated from each other. The gate, body, source and drain electrodes are thus formed to complete the device.

In an alternative embodiment, the enhancement implantation can be carried out after the formation of the poly gate with higher implant energy, e.g., using arsenic or phosphorous implantation for an N-channel LDMOS device.

It should be noted that the above technique can be applied to both N-type and P-type LDMOS. In addition, the enhancement implantation described above can be applied to a LDMOS transistor 300 without a field oxide as shown in FIG. 3.

While the above is a complete description of the preferred embodiments of the present invention, it is possible to use various alternatives, modifications, and equivalents. Therefore, the scope of the present invention should be determined not with reference to the above description but should, instead, be determined with reference to the appended claims, along with their full scope of equivalents. Any feature, whether preferred or not, may be combined with any other feature, whether preferred or not. In the claims that follow, the indefinite article "A" or "An" refers to a quantity of one or more of the item following the article, except where expressly stated otherwise. The appended claims are not to be interpreted as including means-plus-function limitations, unless such a limitation is explicitly recited in a given claim using the phrase "means for". Any element in a claim that does not explicitly state "means for" performing a specified function, is not to be interpreted as a "means" or "step" clause as specified in 35 USC §112, ¶6.

What is claimed is:

1. A lateral double-diffused metal-oxide-semiconductor (LDMOS) transistor device, comprising:
   a semiconductor substrate of a first conductivity type;
   a drift drain region of a second conductivity type opposite the first conductivity type formed on the substrate;
   a source region, a body region, and a drain pickup region formed in the drift drain region, wherein the body region is of the first conductivity type, the source region is of the second conductivity type but more heavily doped than the drift drain region, and the drain contact pickup region is of the second conductivity type;
   a body pickup region formed on the body region laterally adjacent the source region, wherein the body pickup region is of the first conductivity type but more heavily doped than the body region;
   an active channel formed in the body region between the source region and a junction between the body region and the drift drain region;
   an accumulation region formed in the drift drain region between the junction and the drain contact pickup region; and
   an enhancement implant region formed in a portion of the accumulation region proximate the junction, wherein the enhancement implant region contains additional dopants of the second conductivity type, wherein there is a gap between the implant region and the junction.

2. The device of claim 1, further comprising a field insulator formed on the drift drain region laterally adjacent the drain contact pickup region between the drain contact pickup region and the body region.

3. The device of claim 2, wherein the field insulator includes a thin bird's beak region that overlaps the enhancement implant region.

4. The device of claim 1, further comprising an insulated gate electrode disposed on the body region and the drift drain region wherein the insulated gate electrode overlaps a portion of the source region, a portion of the drift drain region, the active channel region, the accumulation region, the enhancement implant region, and a portion of the field insulator.

5. The device of claim 4, further comprising a field insulator formed on the drift drain region laterally adjacent the drain contact pickup region between the drain contact pickup region and the body region, wherein the field insulator is disposed between the gate electrode and the drift drain region.

6. The device of claim 5, wherein the field insulator includes a bird's beak portion that is disposed between the enhancement implant region and the gate electrode.

7. The device of claim 5, further comprising a thick insulator disposed between the enhancement implant region and the gate electrode.

8. The device of claim 1, wherein the substrate is a P-type substrate.

9. The device of claim 1, wherein the drift region is N-type, the body region is P-type, the source and drain pickup regions are N+ type and the body pickup region is P+ type.

* * * * *